US007821781B2

(12) United States Patent
Adenau

(10) Patent No.: US 7,821,781 B2
(45) Date of Patent: Oct. 26, 2010

(54) LIGHTING CONTROL CONSOLE FOR CONTROLLING A LIGHTING SYSTEM

(75) Inventor: Michael Adenau, Würzburg (DE)

(73) Assignee: MA Lighting Technology GmbH, Waldbuettelbrunn (DE)

( * ) Notice: Subject to any disclaimer, the term of this patent is extended or adjusted under 35 U.S.C. 154(b) by 415 days.

(21) Appl. No.: 12/018,949

(22) Filed: Jan. 24, 2008

(65) Prior Publication Data

US 2009/0140667 A1 Jun. 4, 2009

(30) Foreign Application Priority Data

Nov. 30, 2007 (DE) ....................... 10 2007 058 166

(51) Int. Cl.
*H05K 5/00* (2006.01)
*H05K 7/00* (2006.01)
*F21V 33/00* (2006.01)

(52) U.S. Cl. .................................... 361/679.11; 362/85

(58) Field of Classification Search ............ 361/679.11, 361/679.13, 679.14, 679.16, 679.17, 679.55, 361/679.1; 362/85; 345/173

See application file for complete search history.

(56) References Cited

U.S. PATENT DOCUMENTS 3,685,019 A 8/1972 Conroy
4,425,014 A 1/1984 Biepp
5,668,537 A * 9/1997 Chansky et al. .............. 340/3.7
6,262,716 B1 * 7/2001 Raasch ....................... 345/168
6,469,910 B2 10/2002 Lefort

FOREIGN PATENT DOCUMENTS

| | | |
|---|---|---|
| DE | 80 20 621 U | 2/1981 |
| DE | 3016658 | 11/1981 |
| DE | 40 01 448 C | 7/1991 |
| EP | 0010659 | 5/1980 |
| GB | 2074948 A | 11/1981 |
| WO | 99/31945 | 6/1999 |

* cited by examiner

*Primary Examiner*—Jayprakash N Gandhi
*Assistant Examiner*—Anthony M Haughton
(74) *Attorney, Agent, or Firm*—Quarles & Brady LLP

(57) ABSTRACT

A lighting control console for controlling a lighting control system including a digital processor and a digital storage unit. The lighting control console can comprise several control elements, in particular keys, linear regulators and/or induction regulators, which are arranged on the top of the casing and can be used to enter operating commands. The lighting control console encompasses a display device with at least one screen that is arranged on the top of the casing. The data for the user can be graphically displayed on the screen. The lighting control console can include a casing provided with at least one cover, which can be adjusted between a closed position and an open position, wherein the cover covers at least one extra control element arranged in or on the casing in its closed position, thereby protecting the extra control element against external influences in its closed position.

16 Claims, 7 Drawing Sheets

01
06
15
17
16
19
18
13
14
02
08

LIGHTING CONTROL CONSOLE FOR CONTROLLING A LIGHTING SYSTEM

CROSS REFERENCE TO RELATED APPLICATION

This application claims the priority benefit of German Patent Application No. 10 2007 058 166.3 filed Nov. 30, 2007, the contents of which are hereby incorporated by reference as if fully set forth herein.

STATEMENT REGARDING FEDERALLY SPONSORED RESEARCH OR DEVELOPMENT

Not applicable.

FIELD OF THE INVENTION

The invention relates to a lighting control console for controlling a lighting system.

BACKGROUND OF THE INVENTION

Generic lighting control consoles are used for controlling lighting systems, e.g., of the kind used in theaters or concert stages. These lighting systems routinely encompass a plurality of lighting devices, for example, stage spotlights, wherein the lighting devices can often be switched between a plurality of lighting conditions, e.g., varying colors. Conventional lighting systems can here encompass up to several thousand lighting devices. So that such complex lighting systems can be controlled, the generic lighting control consoles are equipped with a digital processor, which permits digital data and signal processing. A digital memory is also provided for storing the data, making it possible in particular to archive lighting programs.

The electronic component of the lighting control console is protected by a casing, which encompasses the digital processor and digital memory in particular. Of course, it is here conceivable for the lighting control console to incorporate several digital processors or several digital memories. The user interface for programming or controlling the lighting program takes the form of control elements provided on the lighting control console, such as keys, linear regulators and/or induction regulators, which the lighting director can use to input operating commands. In addition, generic lighting control consoles are equipped with at least one display unit, e.g., a touch-screen or a conventional display, to graphically depict various data, e.g., the lighting program, to the user.

Known lighting control consoles face conflicting objectives between the compact design desired on the one hand, along with as compact a casing as possible, and the simultaneous capability to control as many functions with the control elements in as differentiated a manner possible. However, the more control elements are provided on the top of the casing, the larger the lighting control console has to be. In addition, the lighting control console must offer resting surfaces for the hands of the user to enable a corresponding level of comfort during operation.

In known lighting control consoles, the manufacturer must reach a certain compromise between the number of control elements and size of the casing and the space available for hand rest.

Therefore, there is a need for a new lighting control console that enables the most compact design possible while allowing the simultaneous installation of a plurality of control elements and a sufficient number of hand rests.

SUMMARY OF THE INVENTION

According to an embodiment of the invention, a lighting control console according to the invention can have at least one other control element that gives the user additional control options. The lighting control console can be based on the idea that a cover shields this extra control element, protecting it against external influences. The cover itself can here be adjusted between a closed position and an open position. Only in the closed position of the cover can the extra control element covered to the outside. By contrast, if the cover is in the open position, the user can input operating commands on the extra control element. As a result, then, the cover that can be adjusted between the closed position and the open position can allow the user to use the extra control element at his discretion. Operating commands can only be input with the extra control element in the open position, while external influences and undesired entry of operating commands on the extra control element are precluded with the cover in the closed position. Since the cover can also be used as a supporting surface in its closed position, this yields a particularly compact design while simultaneously allowing the incorporation of a plurality of control elements, since the normally present number of control elements is increased by the extra control elements.

Another embodiment of the present invention provides a lighting control console for controlling a lighting control system can generate digital actuating commands that can be transmitted via data circuits to the lighting devices of the lighting system. The lighting control console can include at least one digital processor and at least one digital storage unit for generating, managing and storing the actuating commands, a casing that incorporates the digital processor and the digital storage unit, a plurality of control elements that are arranged on the top of the casing and can be used to enter operating commands, and a display device with at least one screen, the display device arranged on the top of the casing, and wherein data for the user can be graphically displayed on the screen. The casing can be provided with at least one cover, which can be adjusted between a closed position and an open position, wherein the cover covers at least one extra control element arranged in or on the casing in its closed position, thereby protecting the extra control element against external influences in its closed position.

The cover can be structurally adjusted between the closed position and the open position in basically any manner desired. For example, the cover can be pivoted to the casing for this purpose, so that it can swivel between the closed position and the open position. However, it can be advantageous to mount the cover so that it can linearly shift on the casing. For example, this can be structurally realized by attaching linear rails, in particular telescoping rails, between the cover and the casing. The ability of the cover to shift linearly ensures that the orientation of the cover need not be altered while being adjusted between the closed position and the open position, so that the top of the cover in the closed position also forms the top of the cover in the open position. Therefore, given a supporting surface on the top of the cover, said supporting surface can remain available in both the open position and in the closed position.

The type of extra control elements arranged under the cover can be entirely optional. In one embodiment, the extra control element can be designed as an alphanumeric keyboard. As a result, this means that the cover shields an alphanumeric keyboard from above, wherein the user can move the cover to its open position to also input complex operating commands on the alphanumeric keyboard.

To provide the highest level of operating comfort possible, the cover can be situated on the lateral edge of the casing on the lighting control console facing the user. Once the cover has been opened, the extra control element, e.g., the alphanumeric keyboard accommodated under the cover, is within direct reach of the user, and can easily and conveniently be used.

Depending on the complexity of the lighting system to be controlled with the lighting control console, the casing can be provided with several covers, which each cover at least one extra control element, e.g., an alphanumeric keyboard each. In order to make the individual extra control elements independently accessible as well, the respective covers can be opened or closed independently of each other.

To further increase comfort in operation, the top of the cover can be designed as an ergonomically molded hand rest. Ergonomic design features in the hand rest can here can include a convex curvature of the hand rest or cushioning of the hand rest.

In addition to the control elements, the design of the display device can play a large role with respect to the compactness of the lighting control console on the one hand, and to the operating comfort when using the lighting control console on the other hand. To simultaneously increase the comfort in operation and enable a compact design for the lighting control console, an embodiment provides that the display device be pivoted to the casing, so that it can rotate between an inwardly swiveled resting position and an outwardly swiveled operating position. Moving the display device in the resting position makes it possible to achieve a particularly compact form of the lighting control console, which simplifies transport of the lighting control console in particular. In the resting position, for example, the display device can dovetail with the surface of the top of the casing in a dimensionally complementary way. By contrast, swiveling open the display device into the operating position gives the user an especially convenient viewing angle on the display device, since the display device extends at a steep angle relative to the top of the casing, for example. One way to structurally design the swiveling position of the display device is to secure the display device on a pivoted carrier element of the casing. The swiveling motion can be manually imparted to the display device by the user. To further increase comfort in operation, however, a driving unit can be provided, which engages between the casing and display device, and enables a motorized adjustment of the display device between the resting and operating positions.

The structural design of the driving unit can include an electric motor and toothed ring, wherein the electric motor is secured to the casing of the lighting control console and meshes with the toothed ring attached to the display device. Actuating the electric motor then allows the driving pinion to adjust the toothed ring and the display device attached thereto, thus pivoting between the resting and operating positions.

In order to prevent the driving unit from falling back undesirably during power outages or electric motor disturbances, the electric motor can be designed to block when at zero current. Given a power outage or an electric motor disturbance, the display device is locked in its current position, preventing the display device from falling back.

Because the display device can be pivoted, the swiveling moments caused by the weight of the display device may vary depending on the adjustment angle. In order to be able to work at uniform actuating forces for adjusting the display device despite these restoring forces that vary as a function of the adjustment angle, it can be advantageous to provide a weight-compensating element between the casing and the display device, in particular between the casing and the toothed ring. The weight-compensating element can be designed in such a way as to always exert a supporting force that is complementary to the restoring forces and compensates for the restoring forces that vary owing to the weight of the display device. As a result, the display device can then be adjusted with vary small, substantially constant actuating forces.

The restoring forces can be compensated by using a gas pressure spring as the weight-compensating element.

One embodiment of the invention is schematically depicted in the drawings, and will be explained below by way of example.

DETAILED DESCRIPTION OF THE EXAMPLE EMBODIMENTS

Figure 1:
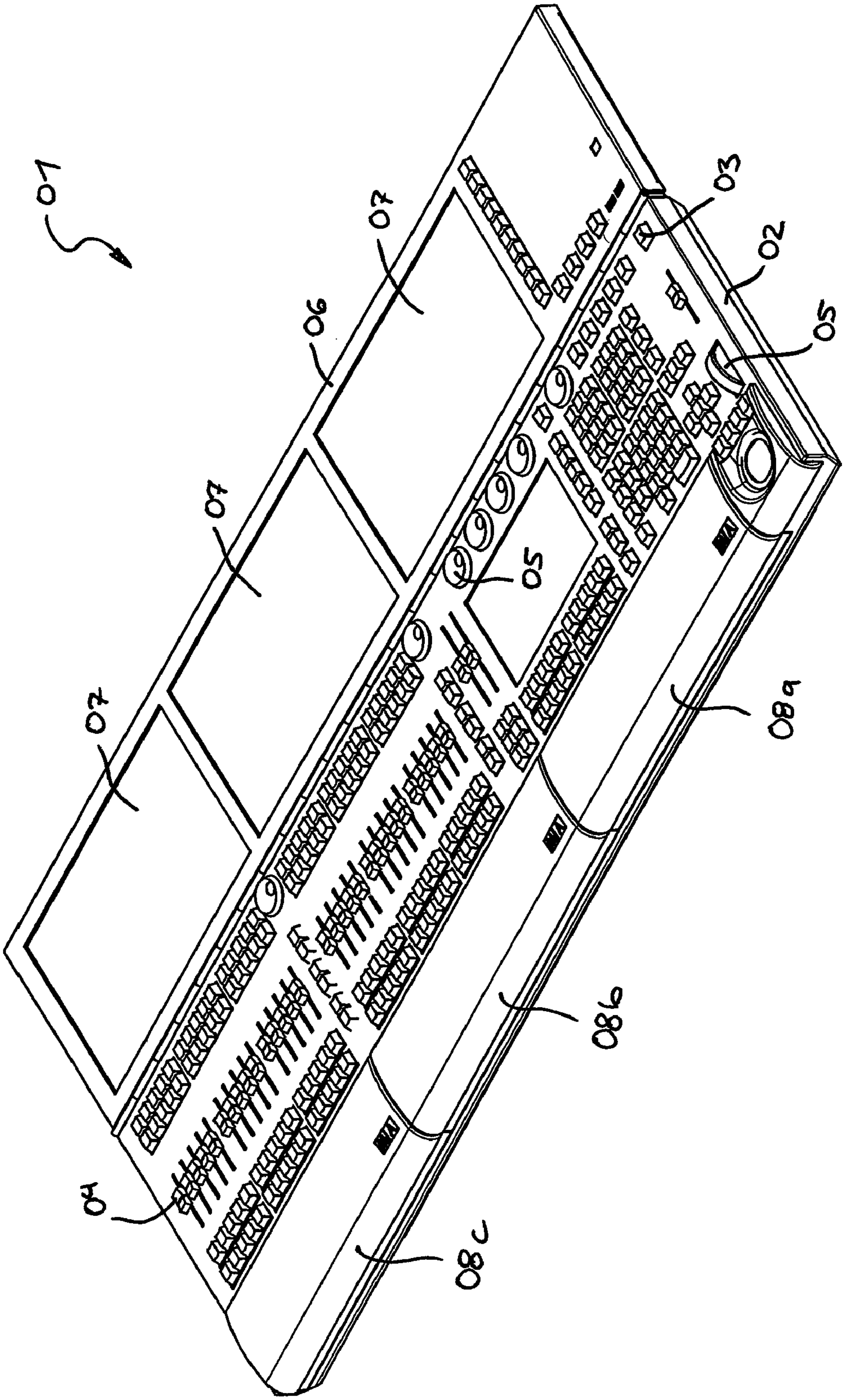
FIG. 1 is a lighting control console with several closed covers in a perspective view from above.

FIG. 1 shows a lighting control console 01 for controlling a complex lighting system. The casing 02 here incorporates several digital processors and digital storage units for generating, managing and storing digital actuating commands. The top of the casing 02 accommodates a plurality of control elements, specifically keys 03, linear regulators 04 and induction regulators 05. In addition, the lighting control console 01 is equipped with a display device 06 pivoted to the casing 02, which comprises a total of three touch-sensitive touch-screen displays 07.

Figure 2:
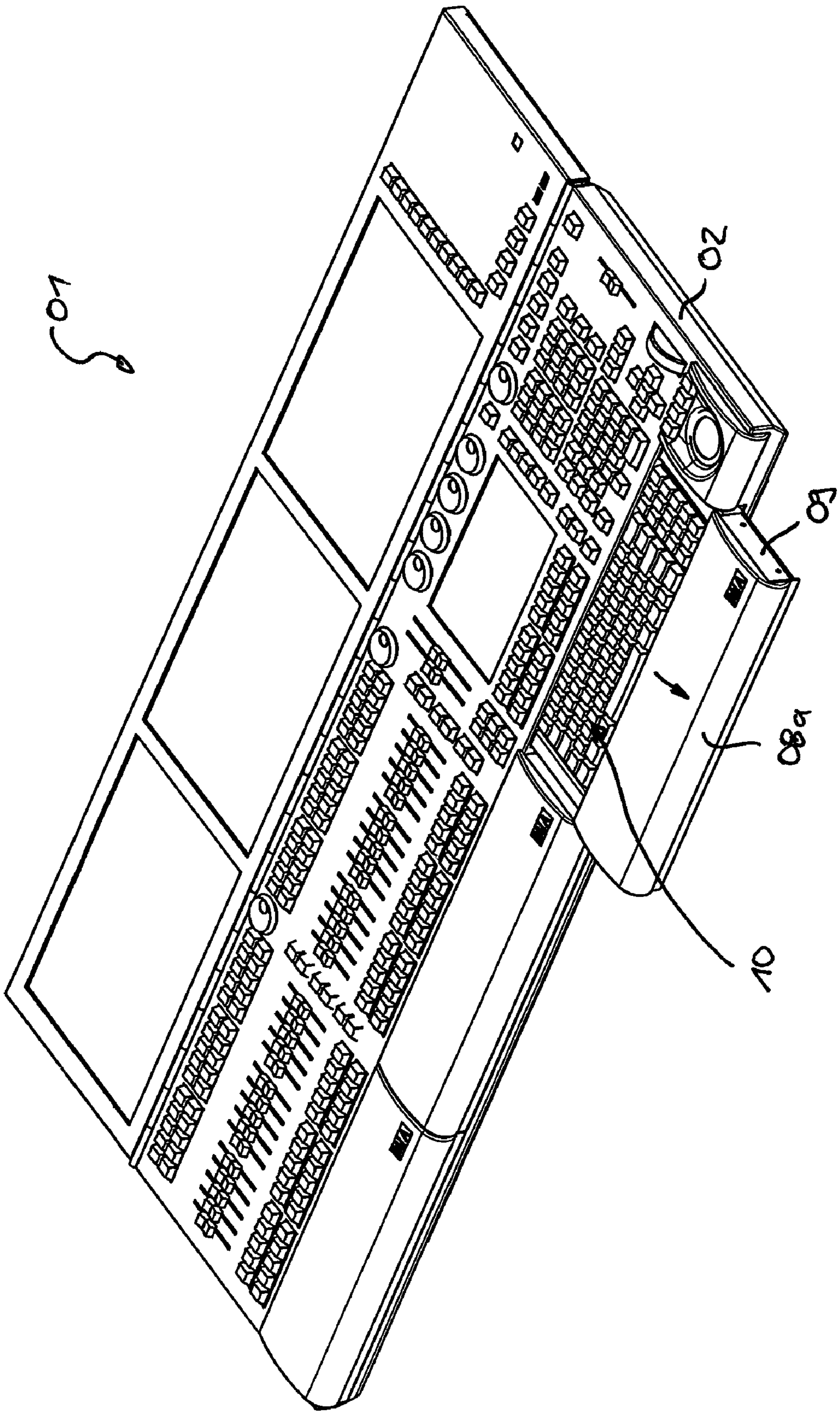
FIG. 2 is a perspective view of the lighting control console according to FIG. 1 with a cover closed.

The lateral edge of the casing 02 facing the user is provided with three covers 08, which each can be adjusted independently from each other between the closed position shown in FIG. 1 and an open position (see FIG. 2).

FIG. 2 shows the lighting control console 01 after opening the right cover 08*a*. This is made possible from a structural standpoint by attaching a respective two telescoping rails 09 on the sides of the covers 08, which secure the covers 08 to the casing 02 so that they can move linearly. Situated under the covers 08 is a respective alphanumeric keyboard 10, with which complex operating commands can be entered.

Figure 3:
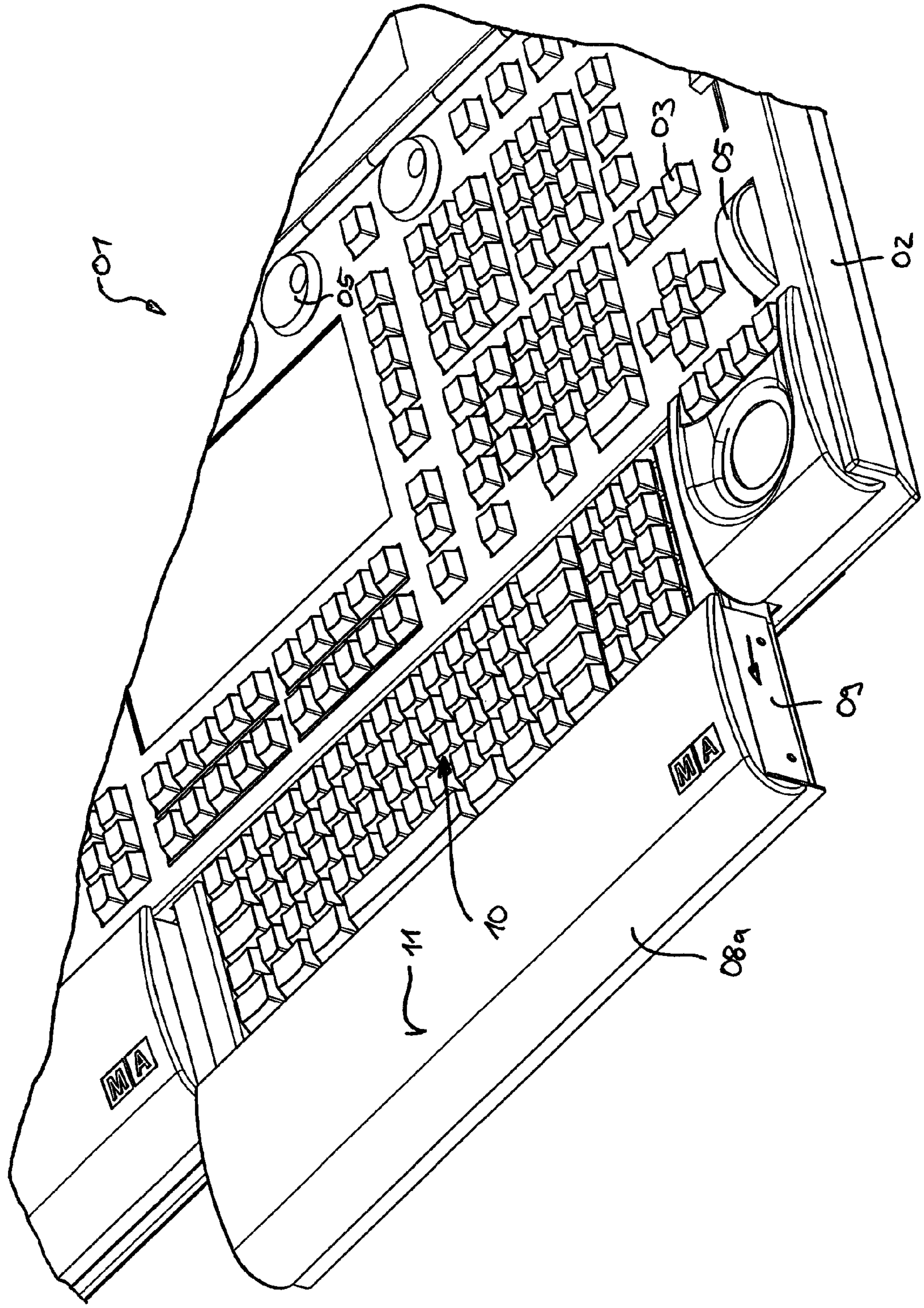
FIG. 3 is the open cover of the lighting control console according to FIG. 2 with the allocated extra control element in a magnified perspective view.

FIG. 3 shows the cover 08*a* in a magnified perspective view. The top of the covers 08*a* is cushioned and convexly curves upward, so as to provide an ergonomically shaped hand rest in this way. Hands can be placed on the hand rest with the covers 08 in the closed position while using the normal control elements 03, 04 and 05. After the covers 08 have been opened, the hand rest 11 can be used to support the hands when entering operating commands on the keyboard 10.

Figure 4:
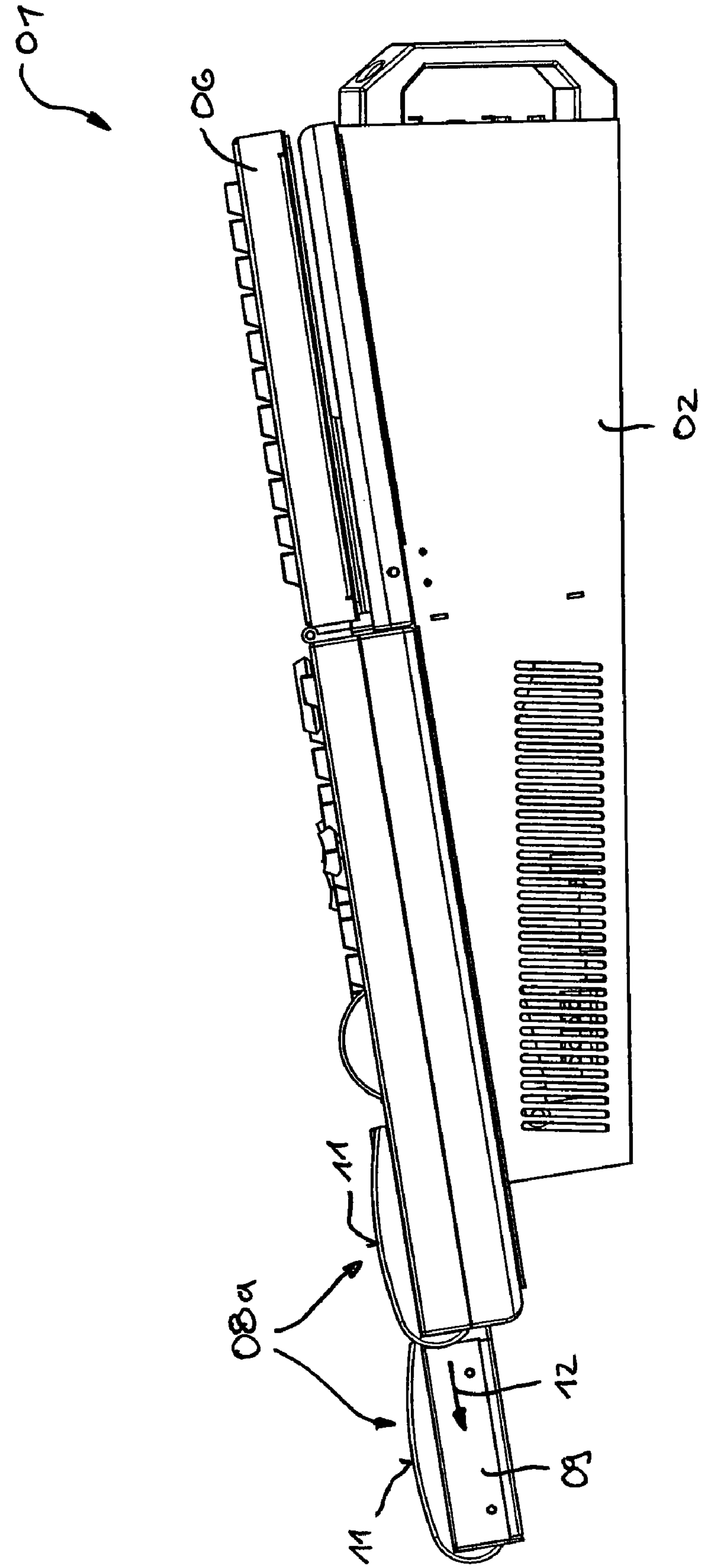
FIG. 4 is the lighting control console according to FIG. 2 in a side view.

FIG. 4 shows the lighting control console 01 in a side view, and denotes the adjustment of the cover 08*a* between the closed position and the open position. The covers 08 are here each mounted to the casing 02 along a linear actuating path 12 with the telescoping rails 09. FIG. 4 further shows the display device 06 swiveled back in the resting position. In this position, the lighting control console 01 takes up less space when packaged, and can be easily transported.

Figure 5:
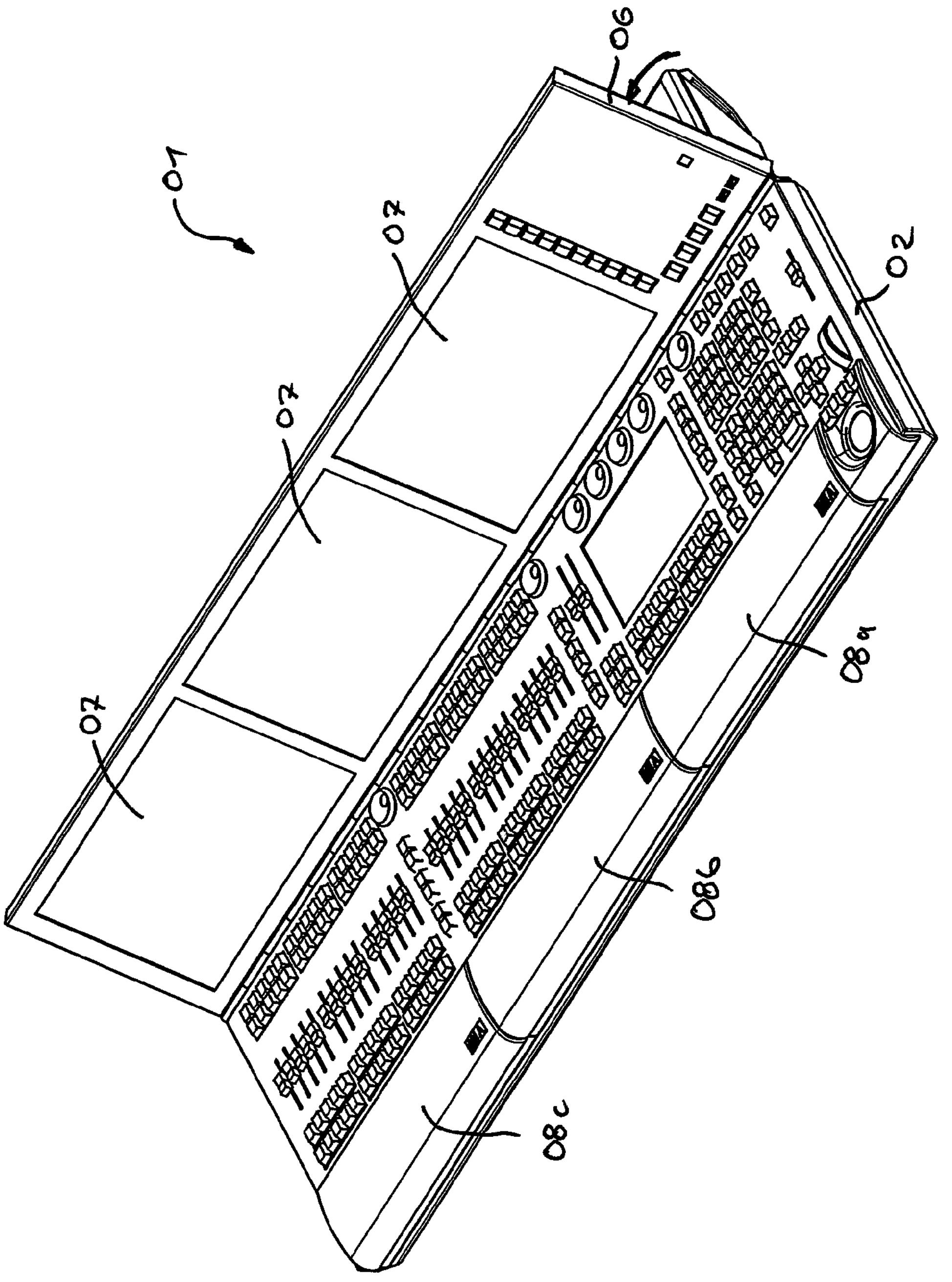
FIG. 5 is a perspective view of the lighting control console according to FIG. 1 with the display device swiveled up into the operating position.

FIG. 5 shows the lighting control console 01 after the display device 06 has been swiveled up in the operating position, which provides the user with a convenient viewing angle on the touch-screen 07.

Figure 6:
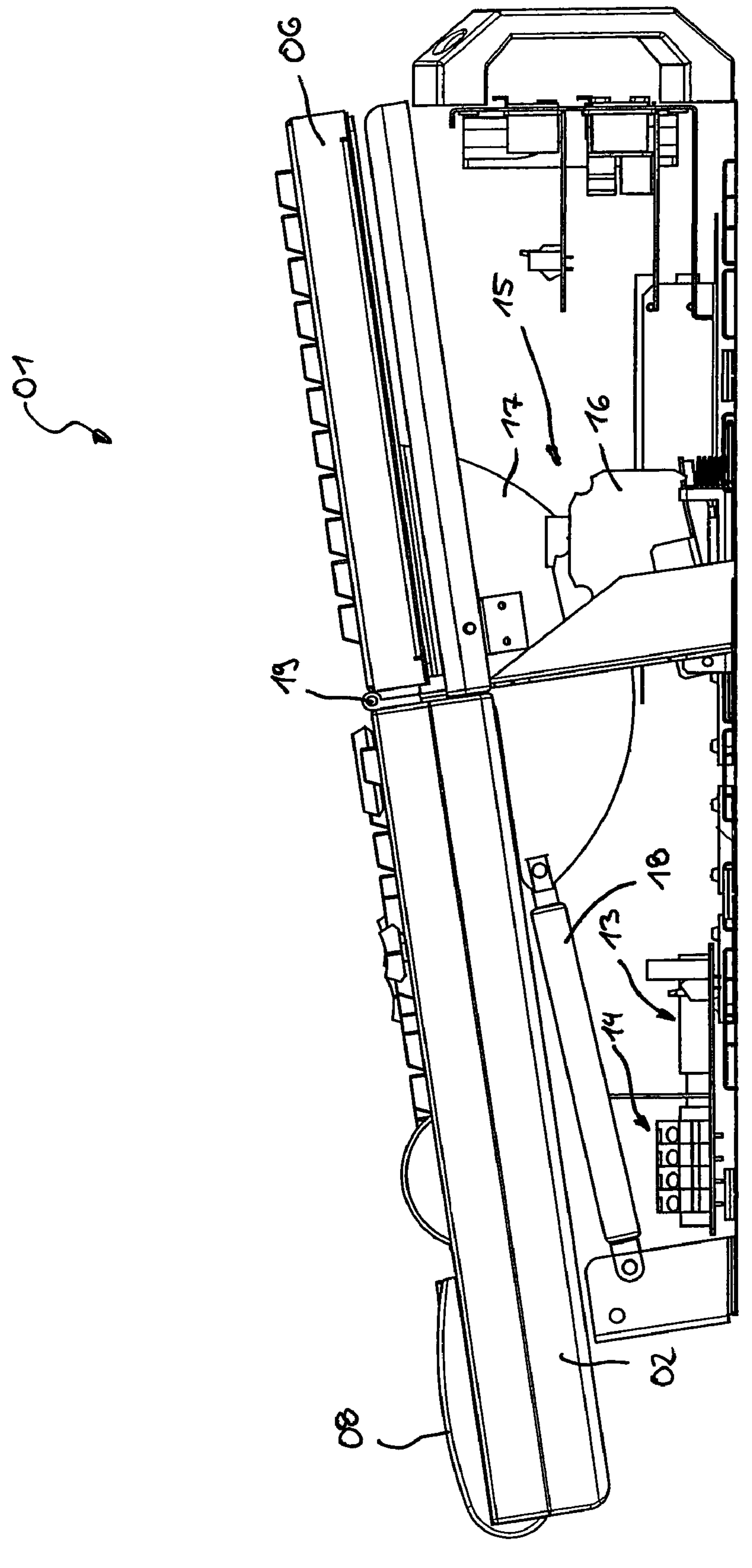
FIG. 6 is a side view illustrating the driving unit for adjusting the display device of the lighting control console according to FIG. 1.

FIG. 6 shows the inside of the lighting control console 01. In addition to the digital processors 13 and the digital storage units 14, the casing interior accommodates a driving unit 15 for the motorized adjustment of the display device 06. The driving unit 15 includes an electric motor 16 rigidly connected with the casing 02, with a driving pinion that meshes with the teeth of a toothed ring 17. The teeth of the toothed ring 17 are not shown in FIG. 6 and FIG. 7. The top end of the toothed ring 17 is secured to the bottom of the display device 06, and turns along with the display device 06 around a swiveling axis 19.

Figure 7:
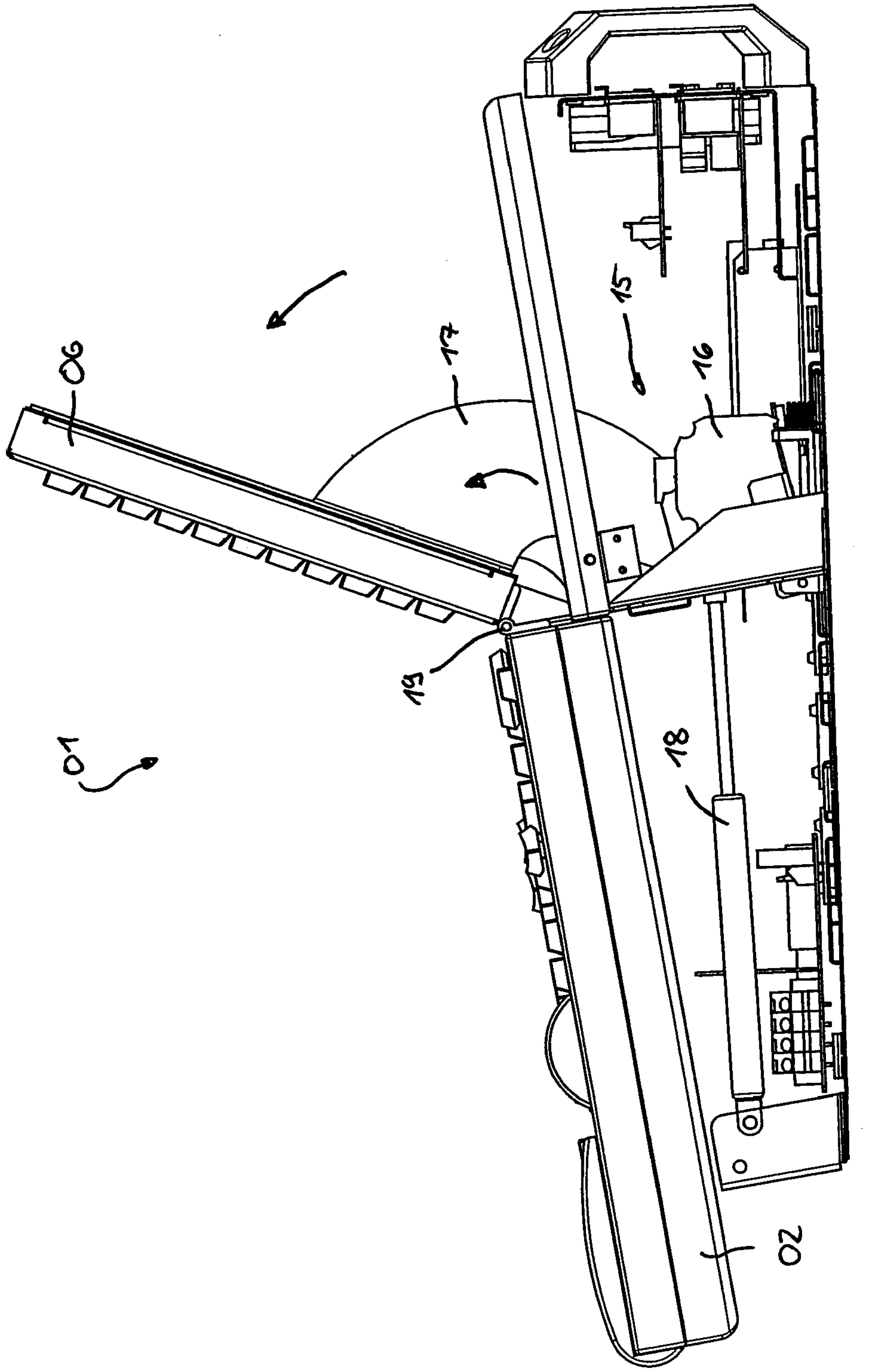
FIG. 7 is a side view illustrating the driving unit according to FIG. 6 after adjusting the display device in the swiveled-up operating position.

FIG. 7 shows the lighting control console 01 after the display device 06 has been swiveled up by the electric motor of the driving unit 15.

In order to compensate for the restoring forces caused by the display device 06 as a function of the actuating angle, a gas pressure spring 18 serves as a weight-compensating element. The two ends of the gas pressure spring 18 here extend between the casing 02 on the one hand and the toothed ring 17 on the other hand.

I claim:

1. A lighting control console for controlling a lighting control system, wherein digital actuating commands are generated in the lighting control console that can be transmitted via data circuits to the lighting devices of the lighting system, the lighting control console comprising:

at least one digital processor and at least one digital storage unit for generating, managing and storing the actuating commands;

a casing that incorporates the digital processor and the digital storage unit;

a plurality of control elements that are arranged on the top of the casing and can be used to enter operating commands;

a display device with at least one screen, the display device arranged on the top of the casing, and wherein data for the user can be graphically displayed on the screen, said display device being coupled to the casing so that it can pivot around a swiveling axis between an operating position and a resting position; and a driving unit connected with said casing and engaging said display device, said driving unit urging said display device between the operating position and the resting position;

wherein the casing is provided with at least one cover, which can be adjusted between a closed position and an open position, wherein the cover covers at least one extra control element arranged in or on the casing in its closed position, thereby protecting the extra control element against external influences in its closed position.

2. The lighting control console according to claim 1, wherein the cover is mounted to the casing so that it can linearly shift.

3. The lighting control console according to claim 2, wherein the cover is mounted to the casing with linear rails, in particular telescoping rails.

4. The lighting control console according to claim 1, wherein the extra control element is a type of alphanumeric keyboard.

5. The lighting control console according to claim 1, wherein the cover is arranged on the lateral edge of the casing facing the user.

6. The lighting control console according to claim 1, wherein at least three adjacent covers are provided on the casing, which each cover at least one extra control element, wherein the covers can be opened independently of each other.

7. The lighting control console according to claim 1, wherein the top of the cover is ergonomically designed and forms a hand rest.

8. The lighting control console according to claim 7, wherein the hand rest is convexly curved.

9. The lighting control console according to claim 7, wherein the hand rest is cushioned.

10. The lighting control console according to claim 1, wherein the display device is mounted to the casing so that it can pivot around a swiveling axis, and can be swiveled back into the resting position and swiveled open into the operating position, in particular steplessly.

11. The lighting control console according to claim 10, wherein the driving unit engages between the casing and the display device, and enables a motorized adjustment of the display device between the resting position and the operating position.

12. The lighting control console according to claim 11, wherein the driving unit comprises a toothed ring secured to the display device and an electric motor secured to the casing, wherein the driving pinion of the electric motor meshes with the teeth of the toothed ring.

13. The lighting control console according to claim 12, wherein the electric motor is blocked when at zero current.

14. The lighting control console according to claim 12, wherein a weight-compensating element is provided between the casing and the display device, in particular between the casing and the toothed ring, which compensates for the restoring forces caused by the weight of the display device.

15. The lighting control console according to claim 14, wherein the weight-compensating element is a gas pressure spring.

16. The lighting control console according to claim 1, wherein the plurality of control elements comprise a least one of a plurality of keys, a plurality of linear regulators, and at least one of a plurality of induction regulators.

* * * * *